(12) United States Patent  
Barford (10) Patent No.: US 7,564,386 B2
(45) Date of Patent: Jul. 21, 2009

(54) PRE-PROCESSING DATA SAMPLES FROM PARALLELIZED DATA CONVERTERS

(75) Inventor: Lee A. Barford, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/941,680

(22) Filed: Nov. 16, 2007

(65) Prior Publication Data

US 2009/0128187 A1 May 21, 2009

(51) Int. Cl.
*H03M 1/12* (2006.01)
(52) U.S. Cl. .................... 341/120; 341/155; 702/77
(58) Field of Classification Search ......... 341/118, 341/120, 155; 700/2, 4; 702/66–78, 180; 708/2, 104; 712/10–22
See application file for complete search history.

(56) References Cited

U.S. PATENT DOCUMENTS

| | | | | | |
|---|---|---|---|---|---|
| 5,943,367 | A | * | 8/1999 | Theunis | 375/285 |
| 5,965,819 | A | * | 10/1999 | Piety et al. | 702/77 |
| 6,026,418 | A | * | 2/2000 | Duncan, Jr. | 702/77 |
| 6,809,668 | B2 | * | 10/2004 | Asami | 341/120 |
| 2008/0018502 | A1 | * | 1/2008 | Wegener | 341/50 |
| 2008/0231484 | A1 | * | 9/2008 | Moore et al. | 341/155 |

* cited by examiner

*Primary Examiner*—Howard Williams (57) ABSTRACT

An apparatus for pre-processing data samples from parallelized analog-to-digital converters (ADC). An ADC converts an analog signal into N parallel digital data samples that are output on N ADC links $x_0$ through $x_{N-1}$. A parallel computation block in communication with the ADC processes the data samples in parallel prior to storage into a memory.

20 Claims, 5 Drawing Sheets

PRE-PROCESSING DATA SAMPLES FROM PARALLELIZED DATA CONVERTERS

BACKGROUND

Many measurement instruments need to sample and convert an analog input signal into a digital form before further processing can be performed. Examples of measurement instruments include, but are not limited to: oscilloscopes, network analyzers, spectrum analyzers, signal analyzers, protocol analyzers, printed circuit board testers, atomic force microscopes, frequency counters, time-domain reflectometers, mass spectrometers, liquid or gas chromatographs, power analyzers, data acquisition cards, ultrasonagraphs, optical distributed temperature sensing systems, polarization analyzers, digital communications analyzers, and jitter analyzers. The conversion from analog to digital form is typically accomplished by an analog-to-digital converter (ADC), sometimes also referred to as a "data converter". As the speed of ADCs increase, the amount of digital data that needs to be stored into memory gets larger. Processing these large amounts of digital data also takes longer.

Figure 1:
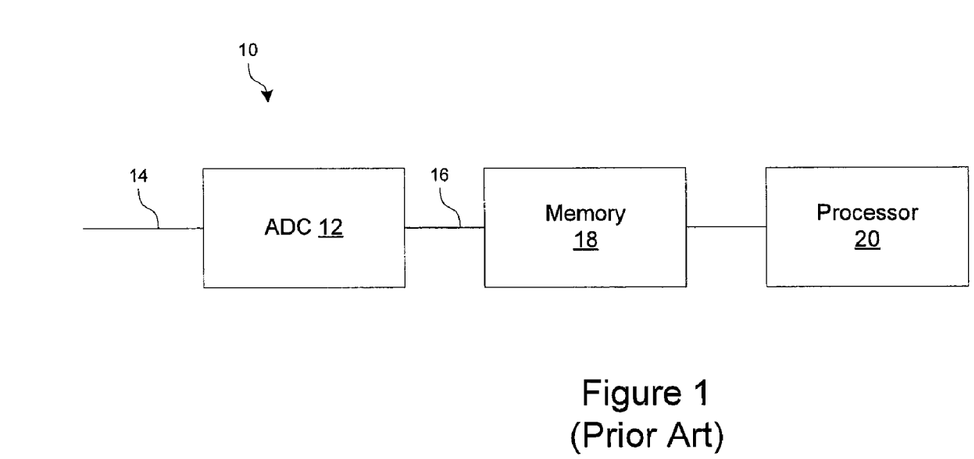
FIG. 1 shows a block diagram of a prior art system for converting an analog signal into digital data samples and storing the digital data samples.
Figure 2:
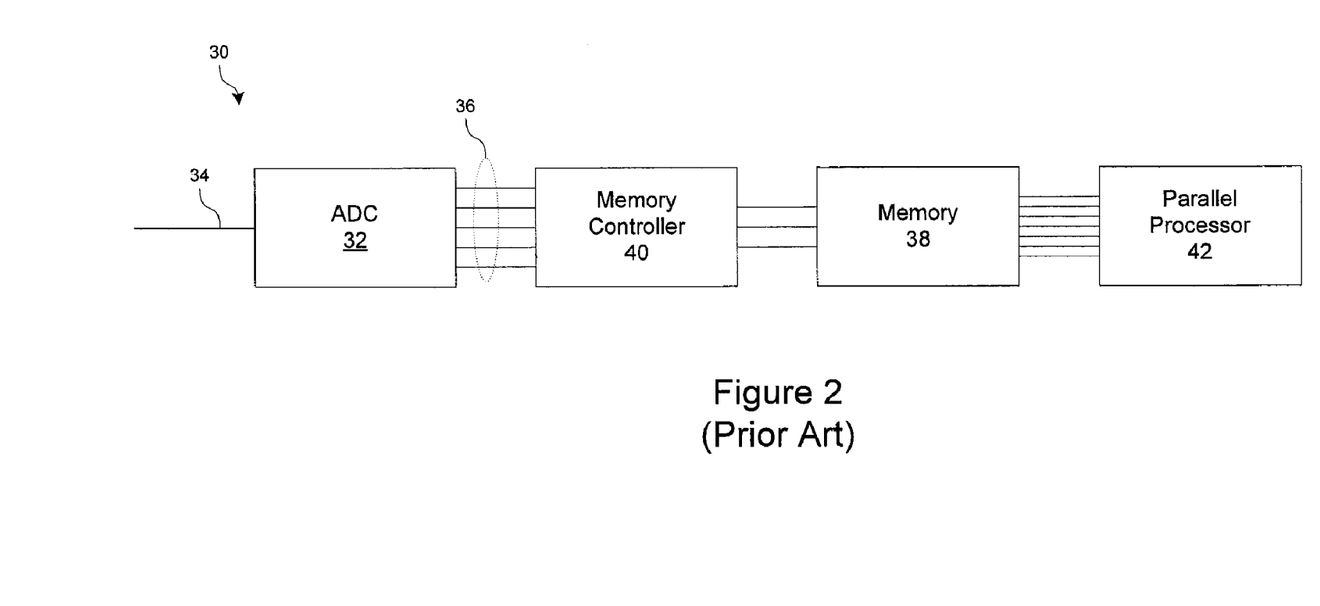
FIG. 2 shows a block diagram of a prior art system for converting an analog signal into digital data and storing the digital data samples.

FIGS. 1 and 2 show block diagrams of typical prior art systems for converting analog data into digital data samples and storing the digital data. FIG. 1 shows a block diagram of a prior art system 10. An ADC 12 receives an analog input 14 and converts it into a digital data sample 16. The data sample 16 is stored in the memory 18 before being sent to a processor 20 for further processing.

FIG. 2 shows a block diagram of another prior art system 30. A parallel, pipelined ADC 32 receives an analog input signal 34 and converts it into N digital data samples 36. Memory controller 40 fans out the N data samples 36 arriving from ADC 32 into memory 38, which includes a number of parallel memories, The memory controller 40 fans out the data so that the higher speed data from the ADC 32 flows into the parallel memories of memory 38 at a slower rate. The data samples stored in memory 38 can be processed further by a parallel processor 42.

The data samples (16, 36) in the systems of FIGS. 1 and 2 need to be stored into the sample memory (18, 38) before processing can begin on those data samples. The speed at which the data samples (18, 38) are processed is also limited by the speed with which the processor (20, 42) can access the sample memory (18, 38). Furthermore, there is a "dead time" associated with these systems—when the system is busy processing a set of data samples from the sample memory, it is unable acquire new data. Finally, the dead time spent processing the data samples is time that the instrument is not sampling the input. As the amount of dead time increases with the amount of data to be processed, the more likely it is that rare events occurring at the input will be missed because the instrument is too busy processing the data samples instead of sampling the input.

DETAILED DESCRIPTION

Figure 3:
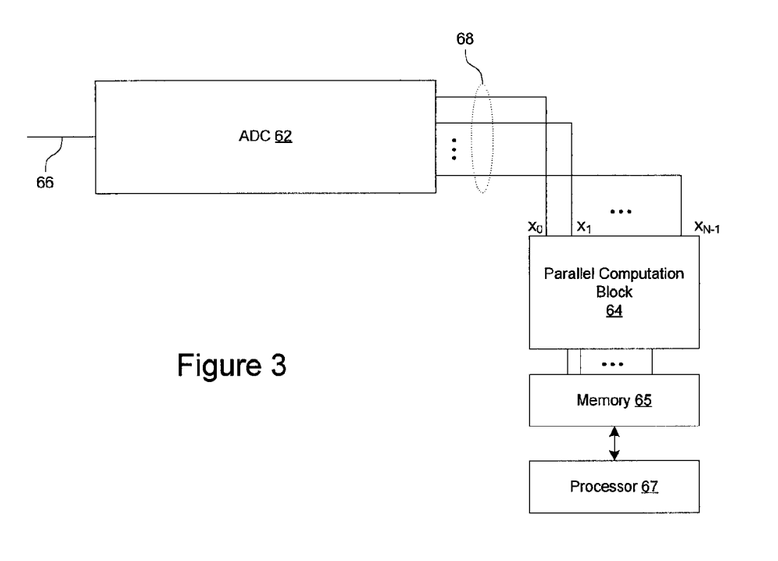
FIG. 3 shows a block diagram of a system having an ADC with pre-processed data samples.

FIG. 3 shows a block diagram of a system 60 having an ADC with pre-processed outputs. The system 60 includes an ADC 62 in communication with a parallel computation element 64. The ADC 62 is a pipelined parallel data converter that converts an analog input signal into parallel digital data samples at the output. The parallel ADC 62 is typically a system created from multiple ADCs. Exemplary ADCs are described in the following publications: U.S. Pat. No. 6,259,281, "Parallel Analog Sampling Circuit and Analog-to-Digital Converter System Incorporating Clock Signal Generator Generating Sub-sampling Clock Signals with Fast and Precisely-timed Edges", by Robert Neff, issued Jul. 10, 2001 and assigned to Agilent Technologies, Inc.; "Analog-to-Digital Converters—20 Years of Progress in Agilent Oscilloscopes" by John Corcoran and Ken Poulton, Agilent Measurement Journal, Vol. 1, pp 34-40, March 2007; and "Building the World's Fastest 8-bit ADC-IN CMOS", by Ken Poulton, IEEE International Microwave Symposium, June 2005. However, any ADC having parallel outputs can be used.

The ADC 62 receives an analog signal at input 66 and converts it into parallel digital data samples at outputs 68. There are a total of N outputs 68. During each cycle of the ADC 62, N data samples are presented at substantially the same time, in parallel, at the outputs 68. Each of the outputs 68 is represented by a single line in the figure, but it should be noted that each single line 68 may also represent a multi-line bus of M bits. For example, each line 68 may represent an 8-line bus for representing an 8-bit digital data sample. Each single line 68 may also carry serial output. The ellipses ( . . . ) in FIG. 3 and in all subsequent Figures are used to indicate that lines or elements may have been omitted from the drawings.

The N outputs 68 are received by parallel computation block 64. The outputs 68 from the ADC 62 will be referred to hereinafter as ADC links $x_0$ through $x_{N-1}$. The parallel computation block 64 can be implemented using one or more field programmable gate arrays (FPGAs), programmable logic devices (PLDs), dedicated hardware such as an application specific integrated circuit (ASIC), digital signal processors (DSPs), microprocessors, or in software running on one or more processors, or any combination thereof. The parallel computation block 64 pre-processes the data samples carried on each of the ADC communication links $x_0$ through $x_{N-1}$. Then, the processed data is stored into a memory 65, where a processor 67 can access the data for further computations. Alternatively, the processed data from the parallel computation block 64 may be passed on to other computation elements before being stored into memory 65.

Figure 4:
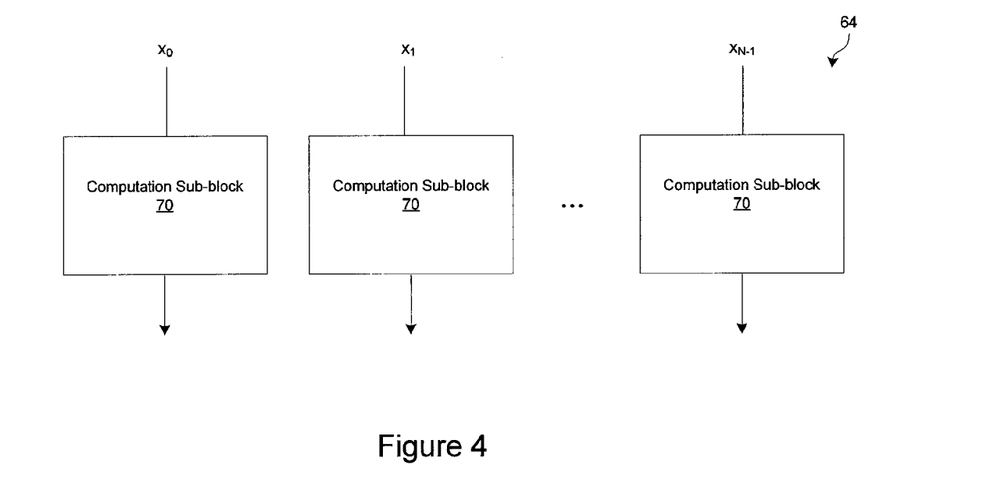
FIG. 4 shows a block diagram of a parallel computation block.

FIG. 4 shows a block diagram of the parallel computation block 64. The parallel computation block 64 includes N computation sub-blocks 70. There is at least one computation sub-block 70 for each ADC link $x_0$ through $x_{N-1}$. Each of the computation sub-blocks 70 receives as input at least one of the ADC links $x_0$ through $x_{N-1}$. Each of the computation sub-blocks 70 pre-processes the data samples it receives on each ADC link in parallel with the other computation sub-blocks, so that incoming data samples on all N ADC links are processed simultaneously prior to storage into a memory. There may be additional inputs to the computation sub-blocks that are not shown for the sake of clarity in FIG. 4.

In one embodiment, each computation sub-block 70 is implemented with its own dedicated device, e.g. its own dedicated FPGA, PLD, ASIC, DSP, or microprocessor. When the computation sub-block 70 is implemented with its own FPGA, PLD, DSP, microprocessor, or other reprogrammable device, the computations performed by the computation sub-block 70 can be changed in mid-operation of the measurement instrument.

Various computations can be pre-processed using a parallel computation block 64. In one embodiment, a parallel computation block computes a histogram on the data samples received on the ADC links $x_0$ through $x_{N-1}$. To compute a histogram, a set of data samples is sorted by value into groups, or "buckets". The number of data samples that fall within each bucket is counted. Each bucket in a histogram counts a unique value (or a unique range of values).

It should be noted that the word "histogram" is often used to refer to a visual graph that represents a frequency distribution of values in a set of data. However, the word "histogram" will be used in this application to refer to the actual raw counts of data that are used to produce such a visual graph.

Figure 5A:
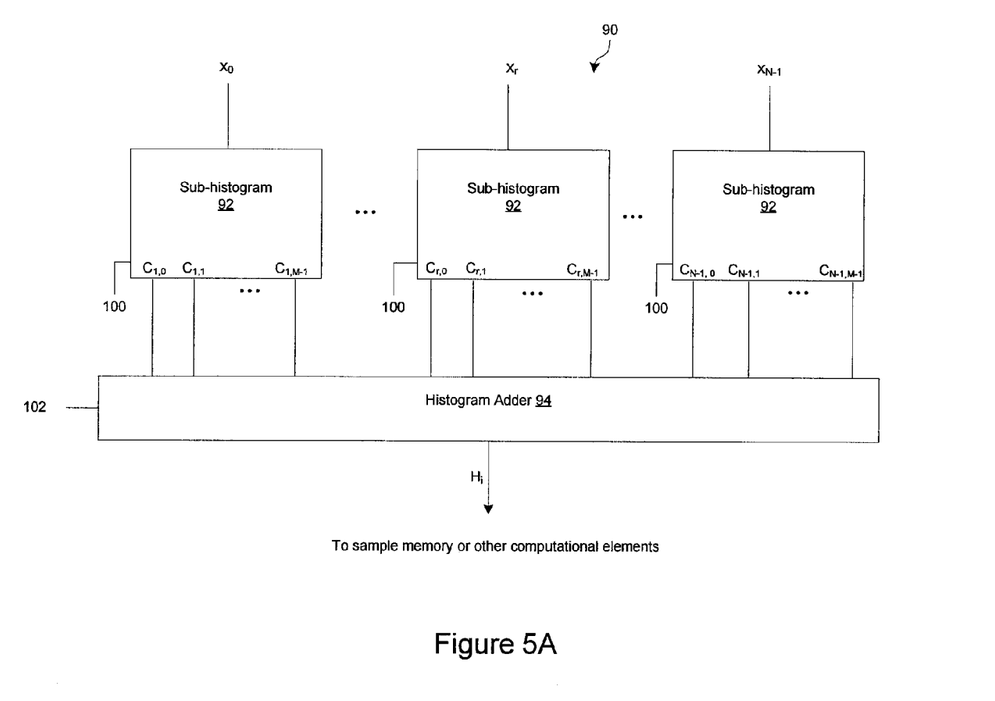
FIG. 5A shows a block diagram of a parallel histogram that computes a histogram on the data samples received from the N ADC links.

FIG. 5A shows a block diagram of a parallel histogram 90 that computes a histogram on the data samples received from the N ADC links, labeled $x_0$ through $x_{N-1}$. The parallel histogram 90 includes N sub-histograms 92. The outputs from each sub-histogram 92 are combined together in a histogram adder 94.

Each sub-histogram 92 computes a histogram on the data samples it receives on its own ADC link, $x_r$, where r is a range of integers such that $0 \leq r \leq N-1$. The sub-histograms 92 are also indexed by r, such that the $r^{th}$ sub-histogram 92 receives the ADC link $x_r$. Let M be the number of "buckets" desired in the histogram. For example, M can be the number of discretization levels that are produced by the ADC 62. Each counter in each sub-histogram can be uniquely identified as $C_{r,i}$, where $0 \leq r \leq N-1$ and $0 \leq i \leq M$.

Each sub-histogram has M counter outputs, $C_{r,0}$ through $C_{r,M-1}$. Each counter $C_{r,0}$ through $C_{r,M-1}$ in a sub-histogram counts a unique data value x (or a unique range of data values), where x is any data value that can be generated by the ADC 62. The data value(s) counted by each counter will depend on the application. Counters across histograms that share a common index i count the same value(s). For example, counter $C_{1,1}$ counts the same value(s) as counters $C_{2,1}$ and $C_{3,1}$; counter $C_{1,2}$ counts the same value(s) as counters $C_{2,2}$, $C_{3,2}$, etc. Let $C_{max}$ be the maximum count that can be made without overflow by any counter $C_{r,0}$ through $C_{r,M-1}$.

Each time a data sample with a value x is received by a sub-histogram 92, the sub-histogram 92 increments the appropriate counter ($C_{r,0}$ through $C_{r,M-1}$) that counts the value x. A clear signal 100 is provided that signals the sub-histograms 92 to reset the counters of the sub-histogram 92 to zero to begin counting data values again. A read signal 102 is provided to latch and transmit the values from the sub-histogram 92 to the histogram adder 94.

When the read signal 102 is asserted, the outputs from the sub-histograms 92 are added and combined in the histogram adder 94 according to the following equation to produce a histogram $H_i$ of sample values:

$$H_i = \sum_{r=0}^{N-1} C_{r,i} \qquad (1)$$

where $C_{r,i}$ represents the output of the $i^{th}$ counter from the $r^{th}$ sub-histogram 92. $H_i$ is the number of times since the last assertion of the clear signal 100 that the sample value counted by counters having the index i was obtained from the ADC 62. The histogram adder 94 can be implemented with a number of adders that add up the counters $C_{r,i}$ for r=0 to r=N−1 for each given i from i=0 to i=M−1.

Note that the clear signal 100 and the read signal 102 should be asserted at least once every $C_{max}$ samples in order not to lose any data samples and to prevent the counters in the sub-histograms 92 from overflowing or rolling over. This does not limit the number of samples that can be accumulated in a histogram, however. To create longer histograms, simply add together multiple histograms $H_i$ in memory.

The parallel histogram 90 can be designed so that no samples from the ADC are ever omitted. The clear signal 100 and read signal 102 are combined so that the counter values are latched and the counters immediately cleared in between the arrival of two consecutive data samples on the ADC links. This requires the use of counters and adders that are fast enough to respond in the time between arrival of consecutive data samples.

Figure 5B:
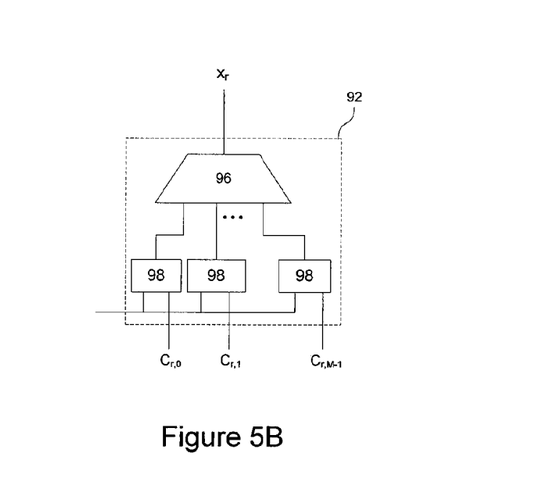
FIG. 5B shows one embodiment for a sub-histogram.

FIG. 5B shows one embodiment for the sub-histogram 92. The sub-histogram 92 includes a demultiplexer 96 and M counters 98 (one counter for each bucket needed). Each of the counters is set up to count a value (or range of values) associated with a different discretization level M. The output of the counters in FIG. 5B are labeled $C_{r,i}$.

In one embodiment, the parallel computation block computes a portion of a Discrete Fourier Transform in parallel on the data samples received from the ADC links $x_0$ through $x_{N-1}$. It is well-known that the Discrete Fourier Transform (DFT) of an array X of n real or complex numbers, is yet another array Y of n complex numbers, expressed by the following equations:

$$Y[k] = \sum_{j=0}^{n-1} X[j]\omega_n^{jk}, \text{ where } 0 \leq k \leq n, \qquad (2)$$

$$\text{where } \omega_n = \exp(-2\pi\sqrt{-1}/n) \qquad (3)$$

$$\omega_n = \exp(-2\pi\sqrt{-1}/n) \qquad (3)$$

Equation 2 can also be rewritten using the following decomposition:

Let $n = n_1 n_2$, $\qquad (4)$ $j = j_1 n_2 + j_2$, and $\qquad (5)$ $k = k_1 + k_2 n_1$, $\qquad (6)$ Then equation (2) can be rewritten as follows:

$$Y[k_1 + k_2 n_1] = \sum_{j_2=0}^{n_2-1}\left[\left(\sum_{j_1=0}^{n_1-1} X[j_1 n_2 + j_2]\omega_{n_1}^{j_1 k_1}\right)\omega_n^{j_2 k_1}\right]\omega_{n_2}^{j_2 k_2} \quad (7)$$

See, for example, Matteo Frigo and Steven G. Johnson, "*The Design and Implementation of FFTW3*", *Proceedings of the IEEE* vol. 93, no. 2, pp 216-231 (2005), especially equation (2) of the paper.

Notice that there are actually two Fourier Transforms in equation (7): an inner one indexed by $j_1$, and an outer one indexed by $j_2$, with multiplication by a so-called "twiddle factor" of $\omega_n^{j_2 k_1}$ in between. Let the inner Fourier Transform ("inner FT") be expressed as follows:

$$Z_{j_2}[k_1] = \omega_n^{j_2 k_1} \sum_{j_1=0}^{n_1-1} X[j_1 n_2 + j_2]\omega_{n_1}^{j_1 k_1} \quad (8)$$

The outer Fourier Transform ("outer FT") can then be rewritten as follows:

$$Y[k_1 + k_2 n_1] = \sum_{j_2=0}^{n_2-1} Z_{j_2}[k_1]\omega_{n_2}^{j_2 k_2} \quad (9)$$

As above, let N be the number of ADC links. Let $Nn_1$ be the number of complex multiply and accumulate (MAC) operations that may be performed in parallel. $n_1$ will generally be chosen on the basis of cost: the larger $n_1$ is, the faster and more expensive the implementation. Let $n_2 = n/n_1$. The inner FT in equation (8) can be applied in parallel to $n/n_2$ sets of data arriving on the N ADC links $x_0$ through $x_{N-1}$. The array $Z_{j_2}[k_1]$ will have a total of $n_2$ elements, and each of those $n_2$ elements will have $n_1$ terms. Therefore, as expected, after the computations of equation (8), there are n intermediate results from the inner FT.

This system can save time over a standard Fast Fourier Transform (FFT) algorithm by computing the inner FT in parallel. The standard FFT algorithm takes an amount of time proportional to n log n (all logarithms used here are in base 2). The computation of the inner FT in equation (8) will be complete after a constant delay. The delay is the amount of time required to accumulate the final samples into the dot products of equation (8). Then the outer FT in equation (9) will take an additional amount of time proportional to $n_2$ log $n_2$. Therefore, the system will speed up the calculation of a Discrete Fourier Transform by up to $$\frac{n \log n}{n_2 \log n_2}$$

times. The speed-up factor is smaller for the same number n when smaller $n_1$ and m are chosen to reduce hardware costs.

Figure 6A:
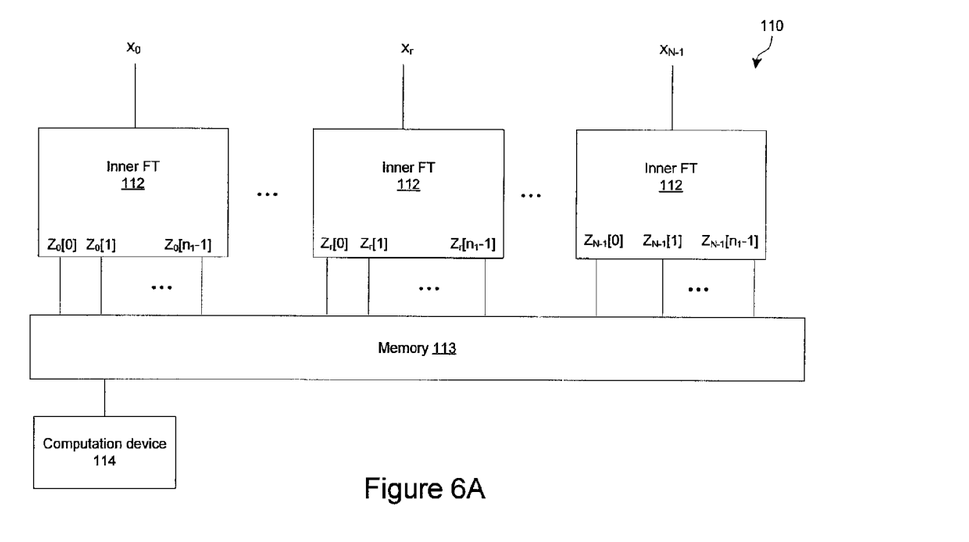
FIG. 6A shows a block diagram of a parallel Fourier Transform that computes an inner Fourier Transform on the data samples received from the N ADC links.

FIG. 6A shows a block diagram of a parallel Fourier Transform ("parallel FT") 110 that computes an inner Fourier Transform on the data samples received from ADC links $x_r$, where r is a range of integers such that $0 \leq r \leq N-1$. The parallel FT 110 includes N inner FT sub-blocks 112. Each inner FT sub-block 112 computes the inner FT as described in equation (8) on the data samples it receives on its own ADC link, $x_r$. The output results from each inner FT sub-block 112 are stored in a memory 113 in this intermediate form, until a later time when a computation device 114 (e.g. a computer, microprocessor, digital signal processor, field programmable gate array (FPGA), application specific integrated circuit (ASIC) or the like) can be used to perform the outer FT on the stored inner FT data. Alternatively, the output results from each inner FT sub-block 112 can be directly passed to other computational elements to perform the outer FT described by equation (9).

Figure 6B:
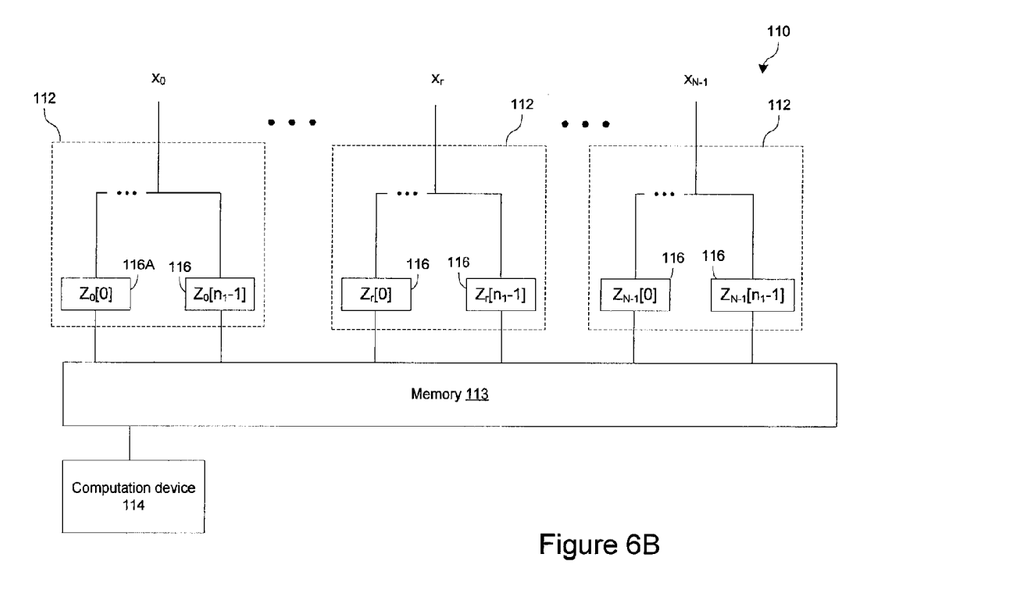
FIG. 6B shows one possible implementation for the inner Fourier Transform sub-blocks in the parallel Fourier Transform.

FIG. 6B shows one possible implementation for the inner FT sub-blocks 112 in the parallel FT 110. Each inner FT sub-block 112 (indicated by the dashed lines in FIG. 6B) includes $n_1$ Z-calculators 116 for calculating $Z_{j_2}[k_1]$ as described by equation (8). Only the first and last Z-calculator 116 are shown in each inner FT sub-block 112 for the sake of clarity. The Z-calculators 116 implement the complex MACs required for each Z-term in equation (8). Each Z-calculator 116 first calculates the summation of $n_1$ product terms $X[j_1 n_2 + j_2] \cdot \omega_{n_1}^{j_1 k_1}$ and then multiplies the summation by a twiddle factor $\omega_n^{j_2 k_1}$ once the last term in the summation has been received and added. The Z-calculators 116 are formed using integer, fixed point, or floating point adders and multipliers that are well-known in the art and need not be described in further detail here. (Multiplication by the twiddle factor $\omega_n^{j_2 k_1}$ can also be performed at a later time by the computation device 114, after each summation $n_1$ product terms $X[j_1 n_2 + j_2] \cdot \omega_{n_1}^{j_1 k_1}$ has been stored into the memory 113, but before the outer FT is calculated.) Once the Z-calculators 116 have finished calculating the Z-terms, the results are stored in memory 113.

At time t, the value $X[n_2 t + r]$ is transmitted from the ADC to the parallel FT 110 on ADC link $x_r$, for $t = 0, 1, 2, \ldots, n_1 - 1$.

Refer back to equation (8). Let $j_1$ be the index for time t ranging from 0 to $n_1 - 1$; let $j_2$ be the index for the inner FT sub-blocks 112, which ranges from 0 to $n_2 - 1$; let $k_1$ range from 0 to $n_1 - 1$ As each value arrives on an ADC link $x_r$, it is sent to each Z-calculator 116.

For example, consider the first Z-element $Z_0[k_1]$, which is calculated by the first inner FT sub-block 112. The first term in the first Z-element $Z_0[k_1]$ is $Z_0[0]$, which is calculated by the Z-calculator 116A in FIG. 6. In this example, $j_2 = 0$, $k_1 = 0$, and $j_1$ represents the time index ranging from 0 to $n_1 - 1$. Thus:

$$Z_0[0] = \omega_n^{0 \cdot 0}((X[0 \cdot n_2 + 0]\omega_{n_1}^{0 \cdot 0}) + (X[1 \cdot n_2 + 0]\omega_{n_1}^{1 \cdot 0}) + (X[2 \cdot n_2 + 0]\omega_{n_1}^{2 \cdot 0}) + \ldots)$$

Notice that as soon as each value arrives on the ADC link $x_0$, it can be immediately plugged into calculations for the relevant product term $X[j_1 n_2 + j_2] \cdot \omega_{n_1}^{j_1 k_1}$ in $Z_0[0]$ The final value for the Z-term $Z_0[0]$ can not be calculated until the final set of values in the array $X[n]$ is received, and the summation of the product terms $X[j_1 n_2 + j_2] \cdot \omega_{n_1}^{j_1 k_1}$ can be completed and multiplied by the twiddle factor $\omega_n^{j_2 k_1}$.

As another example, consider the second term $Z_0[1]$ in the first Z-element $Z_0[k_1]$. $Z_0[1]$ is calculated by a Z-calculator that is not explicitly shown in FIG. 6. In this example, $j_2 = 0$, $k_1 = 1$, and $j_1$ represents the time index ranging from 0 to $n_1 - 1$. Thus:

$$Z_0[1] = \omega_n^{0 \cdot 1}((X[0 \cdot n_2 + 0]\omega_{n_1}^{0 \cdot 1}) + (X[1 \cdot n_2 + 0]\omega_{n_1}^{1 \cdot 1}) + (X[2 \cdot n_2 + 0]\omega_{n_1}^{2 \cdot 1}) + \ldots)$$

As each value arrives on the ADC link $x_0$, the calculations for $Z_0[1]$ can be done in parallel with the calculations for $Z_0[0]$, and with all of the calculations for $Z_0[k_1]$. Additionally, all of the calculations for $Z_0[k_1]$ are done in parallel with the calculations of $Z_1[k_1]$, $Z_2[k_1]$, and the other $Z_{j2}[k_1]$ terms in the inner FT sub-blocks 112. Although the calculations are not finished until the last value is received from X, the parallel implementation means that the calculations will be finished after a constant delay from when the last set of values in X is received.

Then the final values of $Z_0[0]$, ... $Z_0[n_1-1]$, $Z_1[0]$, ..., $Z_1[n_1-1]$, ..., $Z_{N-1}[0]$, ..., $Z_{N-1}[n_1-1]$ are read out of the Z-calculators 116 and into a memory 113. The memory 113 is accessible by computation device 114, which computes the outer Fourier Transform Y according to equation (9). It is well-known in the art how to compute equation (9) using a Fast Fourier Transform.

In one embodiment, the parallel computation block is used to filter the data received from the ADC links $x_0$ through $x_{N-1}$. Such filtering may need to be done for any number of reasons: for calibration correction (including correction of timing and digitization level inaccuracies within the ADC), for impedance mismatch correction between the instrument probe and the signal line being probed, for estimation of the signal shape at a location removed from the probing point, and many other reasons.

Figure 7:
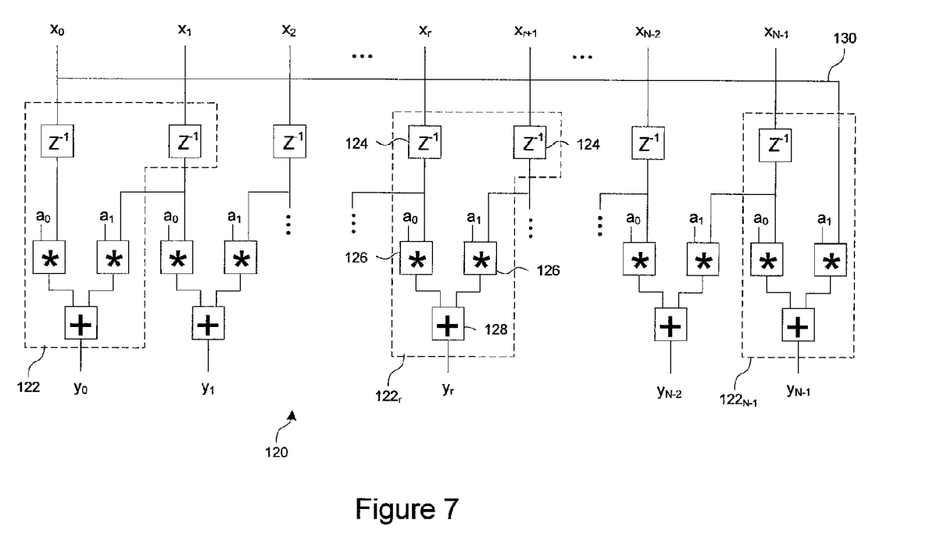
FIG. 7 shows a block diagram of an exemplary parallel Finite Impulse Response filter.

FIG. 7 shows a block diagram of an exemplary parallel Finite Impulse Response (FIR) filter 120. As in the other embodiments, there are N ADC links $x_r$, where r is an integer such that $0 \leq r \leq N-1$. Let $x(t)$ be the $t^{th}$ sample value arriving at time t, and let $y(t)$ be the output of the FIR digital filter at time t, where $t=0, 1, 2, 3 \ldots$. There is theoretically no upper limit on t, because FIR filter 120 can operate on incoming samples continuously, in a streaming mode. Let $a_0, a_1, \ldots a_M$ be the FIR filter coefficients (taps). The parallel FIR filter 120 computes $y(t)$, as expressed by the following equation:

$$y(t) = \sum_{k=0}^{M} x(t+k) a_k \quad (10)$$

The parallel FIR filter 120 in FIG. 7 is a parallel implementation of equation (10), where M=1. The parallel FIR filter 120 includes N filter sub-blocks 122 (outlined in dashed lines). Each filter sub-block 122 includes delay elements 124 (e.g. buffers), multipliers 126, and an adder 128.

Only a few selected filter sub-blocks 122 are outlined in FIG. 7, since components of the filter sub-blocks 122 overlap each other and would unnecessarily clutter the drawing. Furthermore, only a two-tap (M=1) filter is shown in FIG. 7 to keep the explanation simple—an increased number of taps would greatly increase the complexity of the figure without expositing any new principle. However, one of ordinary skill in the art can extrapolate from this example to design filters with more than two taps.

The samples $x(0), x(N), x(2N), \ldots$ etc. arrive on ADC link $x_0$. The samples $x(1), x(N+1), x(2N+1), \ldots$ etc. arrive on ADC link $x_1$, and so on and so forth. Therefore, the samples $x(r)$, $x(N+r), x(2N+r), \ldots$ etc. arrive on ADC link $x_r$ for $0 \leq r \leq N-1$. Similarly, the filter results $y(r), y(N+r), y(2N+r), \ldots$ etc. are generated on the outputs labeled $y_r$ for $0 \leq r \leq N-1$.

Refer now to the $r^{th}$ filter sub-block $122_r$ in FIG. 7. The following description of filter sub-block $122_r$ is generic and applicable to all of the filter sub-blocks 122 in the parallel FIR filter 120 with the exception of the $(N-1)^{th}$ filter sub-block $122_{N-1}$. The $(N-1)^{th}$ filter sub-block $122_{N-1}$ is a special case which will be discussed in detail further below.

Filter sub-block $122_r$ receives a sequence of data samples $x(r), x(N+r), x(2N+r), \ldots$ etc. on ADC link $x_r$. Filter sub-block $122_r$ also receives a second sequence of data samples $x(r+1), x(N+r+1), x(2N+r+1), \ldots$ etc. on ADC link $x_{r+1}$. For now, consider just the first data sample in each of these two sequences, namely $x(r)$ and $x(r+1)$. Each of these data sample $x(r)$ and $x(r+1)$ is sent through a delay element 124. After passing through the delay elements 124, each data sample is multiplied with its respective filter coefficient. Multipliers 126 are used to multiply $x(r)$ by $a_0$, and $x(r+1)$ by $a_1$. The products $a_0 \cdot x(r)$ and $a_x \cdot x(r+1)$ are summed together by an adder 128 to generate $y(r)$. The remaining data samples in the sequences are processed in the same manner.

Refer now to the $(N-1)^{th}$ filter sub-block $122_{N-1}$ in FIG. 7. Filter sub-block $122_{N-1}$ receives a sequence of data samples $x(N-1), x(2N-1), x(3N-1), \ldots$ etc. on ADC link $x_{N-1}$. Each of these data samples is sent to a delay element 124. Filter sub-block $122_{N-1}$ also receives a second sequence of data samples $x(N), x(2N), x(3N), \ldots$ etc. The second sequence is obtained by connecting to the first ADC link, $x_0$ with a look-ahead link 130. For now, consider just the first data sample in each of these two sequences, namely $x(N-1)$ and $x(N)$.

The $(N-1)^{th}$ filter sub-block $122_{N-1}$ is able to receive both $x(N-1)$ and $x(N)$ because there is no delay element 124 in the path of the look-ahead link 130, while there is a delay element 124 in the path of ADC link $x_{N-1}$. The data samples are then multiplied with their respective filter coefficient. Multipliers 126 are used to multiply $x(N-1)$ by $a_0$, and $x(N)$ by $a_1$. The products $a_0 \cdot x(N-1)$ and $a_x \cdot x(N)$ are summed together by an adder 128 to generate $y(N-1)$. The remaining data samples in the sequences are processed in the same manner.

Expanding the number of M taps up to N is straightforward. There will be M-1 of the filter output computations taking inputs from the ADC links $x_0$ through $x_{N-1}$. If $2N \geq M > N$, then a second layer of delay elements 124 must be added to the ADC links. If $3N \geq M > N$, then a third layer of delay elements 124 must be added, and so on and so forth.

Other types of filters may be implemented using this parallel structure as well. By appending appropriate further stages of delays, adders, and multipliers to the y outputs in a manner well-known to those of ordinary skill in the art, Infinite Impulse Response (IIR) filters may be also implemented.

In one embodiment, time-dependent filters can also be implemented using a parallel computation block. Time-dependent filters implement modulations such as multiplying each sample by a function of time $f(t)$. Examples of $f(t)$ commonly used include $\exp(2\pi j t)$, $\sin(2\pi t)$, $\cos(2\pi t)$, etc. where $j = \sqrt{-1}$.

Figure 8:
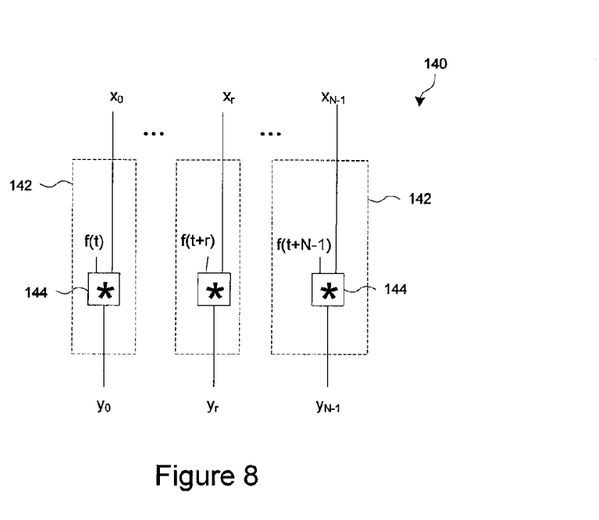
FIG. 8 shows a block diagram of an exemplary parallel time-dependent filter.

FIG. 8 shows a block diagram of an exemplary parallel time-dependent filter 140. The parallel time-dependent filter 140 can be considered a variant of the previously described parallel FIR filter 120 described in FIG. 7, by regarding the parallel time-dependent filter 140 as a one-tap parallel FIR filter with time-varying taps.

Data samples are received on N ADC links $x_r$, where r is a range of integers such that $0 \leq r \leq N-1$. A multiplier 144 multiplies each data sample by a time-dependent function. Let t be the time that the data sample arriving on $x_0$ was taken. Then the time-dependent filter 140 can be described by the following equation:

$$y_r = f(t+r) \cdot x_r \quad (11)$$

There are many other kinds of computations that can be performed in parallel in the parallel computation block 64 of FIG. 3. For example, the parallel computation block 64 can be designed to select the maximum value of data incoming on the ADC links $x_0$ through $x_{N-1}$, by using comparators. Similarly, selecting the minimum value of data incoming on the ADC links can also be implemented with comparators. An averaging computation that determines the average value of the data on the ADC links can be implemented using adders and dividers. A random data selector that picks a random value from the values on the ADC links can also be implemented in parallel computation block 64 using a randomizer. Many of these computations are useful in applications where the amount of sampled data may be greater than what is actually needed. For example, when the time scale of a display screen in an oscilloscope is zoomed out, not every piece of the sampled input data needs to be displayed. Instead, the data points displayed on-screen may include one or more of the maximum value, minimum value, average value, or random value in selected portions of the sampled data.

Although the present invention has been described in detail with reference to particular embodiments, persons possessing ordinary skill in the art to which this invention pertains will appreciate that various modifications and enhancements may be made without departing from the spirit and scope of the claims that follow.

What is claimed is:

1. An apparatus, comprising:
   an analog-to-digital converter (ADC) that converts an analog signal into N parallel digital data samples output on N ADC links $x_0$ through $x_{N-1}$; and
   a parallel computation block in communication with the ADC that processes the data samples in parallel prior to storage into a memory,
   wherein the parallel computation block divides a computation into N related and substantially similar sub-computations performed by N sub-blocks, each sub-block receiving at least one of the N ADC links as input, each sub-block processing the data samples received at its input in cooperation with the other sub-blocks to collectively generate a solution to the computation.

2. An apparatus as in claim 1, without a memory controller between the ADC and the parallel computation block.

3. An apparatus as in claim 2, without a memory between the ADC and the parallel computation block.

4. An apparatus as in claim 1, wherein the parallel computation block is implemented with at least one device selected from the group consisting of: field programmable gate arrays (FPGAs), programmable logic devices (PLDs), application specific integrated circuits (ASICs), digital signal processors (DSPs), and microprocessors.

5. An apparatus as in claim 4, wherein each sub-block is implemented with its own dedicated device.

6. An apparatus as in claim 1, further comprising:
   a memory that stores the output of the parallel computation block.

7. An apparatus as in claim 1, wherein the parallel computation block computes a partial Fourier Transform on the data samples.

8. An apparatus as in claim 1, wherein the parallel computation block is a Finite Impulse Response (FIR) filter.

9. An apparatus as in claim 8, wherein each of the N sub-blocks includes at least one delay element.

10. An apparatus as in claim 9, wherein the N ADC links are identified as ADC links $x_0$ through $x_{N-1}$, and the $(N-1)^{th}$ sub-block receives ADC link $x_0$ as input.

11. An apparatus as in claim 10, wherein the FIR filter computes $$y(t) = \sum_{k=0}^{M} x(t+k) a_k.$$

12. An apparatus as in claim 1, wherein the parallel computation block is an Infinite Impulse Response (IIR) filter.

13. An apparatus as in claim 1, wherein the apparatus is a measurement instrument.

14. An apparatus, comprising:
    an analog-to-digital converter (ADC) that converts an analog signal into N parallel digital data samples output on N ADC links $x_0$ through $x_{N-1}$; and
    a parallel computation block in communication with the ADC that processes the data samples in parallel prior to storage into a memory,
    wherein the parallel computation block further comprises N sub-blocks, each sub-block receiving at least one of the N ADC links as input, each sub-block processing the data samples received at its input in parallel with the other sub-blocks,
    wherein the parallel computation block generates a first histogram from the data samples.

15. An apparatus as in claim 14, wherein each of the N sub-blocks generates sub-histograms on the data samples received on its ADC link.

16. An apparatus as in claim 15, wherein the parallel computation block combines the sub-histograms generated from the N sub-blocks to generate the first histogram.

17. An apparatus, comprising:
    an analog-to-digital converter (ADC) that converts an analog signal into N parallel digital data samples output on N ADC links $x_0$ through $x_{N-1}$; and
    a parallel computation block in communication with the ADC that processes the data samples in parallel prior to storage into a memory,
    wherein the parallel computation block further comprises N sub-blocks, each sub-block receiving at least one of the N ADC links as input, each sub-block processing the data samples received at its input in parallel with the other sub-blocks,
    wherein each of the N sub-blocks compute inner Fourier Transforms on the data samples received on its ADC link, and
    wherein the inner Fourier Transform includes a calculation of the expression $$\sum_{j_1=0}^{n_1-1} X[j_1 n_2 + j_2] \omega_{n_1}^{j_1 k_1},$$

further comprising:
$n_1$ Z-calculators that determine $$\sum_{j_1=0}^{n_1-1} X[j_1 n_2 + j_2] \omega_{n_1}^{j_1 k_1}$$

for each $k_1$ from 0 to $n_1-1$ and for each $j_2$ from 0 to $n_2-1$.

18. An apparatus as in claim 17, further comprising:

a memory that stores the inner Fourier Transforms; and a processor that computes outer Fourier Transforms on the inner Fourier Transforms stored in the memory.

19. An apparatus, comprising:

an analog-to-digital converter (ADC) that converts an analog signal into N parallel digital data samples output on N ADC links $x_0$ through $x_{N-1}$; and a parallel computation block in communication with the ADC that processes the data samples in parallel prior to storage into a memory, wherein the parallel computation block further comprises N sub-blocks, each sub-block receiving at least one of the N ADC links as input, each sub-block processing the data samples received at its input in parallel with the other sub-blocks, wherein the parallel computation block is a time-dependent filter.

20. An apparatus as in claim 19, wherein each of the N sub-blocks includes a multiplier that multiplies data samples received on its ADC link by a time-dependent function.

\* \* \* \* \*